US008594249B2

(12) United States Patent
Marsili

(10) Patent No.: US 8,594,249 B2
(45) Date of Patent: Nov. 26, 2013

(54) DEVICE AND METHOD FOR DETECTING A USEFUL SIGNAL BY DETECTING A PERIODIC SIGNAL CONTAINED IN THE USEFUL SIGNAL

(75) Inventor: Stefano Marsili, Fürnitz (AT)

(73) Assignee: Intel Mobile Communications GmbH, Neubiberg (DE)

( * ) Notice: Subject to any disclaimer, the term of this patent is extended or adjusted under 35 U.S.C. 154(b) by 2523 days.

(21) Appl. No.: 11/090,811

(22) Filed: Mar. 25, 2005

(65) Prior Publication Data

US 2005/0220222 A1 Oct. 6, 2005

Related U.S. Application Data

(63) Continuation of application No. PCT/DE03/02865, filed on Aug. 28, 2003.

(30) Foreign Application Priority Data

Sep. 26, 2002 (DE) .................................. 102 45 047

(51) Int. Cl.
*H04L 27/06* (2006.01)
(52) U.S. Cl.
USPC ........................... 375/343; 375/316; 375/340
(58) Field of Classification Search
USPC .......................................... 375/343, 316, 340
See application file for complete search history.

(56) References Cited

U.S. PATENT DOCUMENTS

| 5,734,441 | A  | * | 3/1998 | Kondo et al. ................ 348/700 |
| 5,959,682 | A  | * | 9/1999 | Kim et al. .................... 348/511 |
| 6,393,077 | B1 | * | 5/2002 | Usui ............................ 375/343 |
| 2002/0027953 | A1 | * | 3/2002 | Hwang et al. ................ 375/232 |

FOREIGN PATENT DOCUMENTS

| GB | 2 016 246 A | 9/1979 |
| RU | 2 055 395 C1 | 2/1996 |

OTHER PUBLICATIONS

IEEE 802.11a—Part 11: Wireless LAN Medium Access Control (MAC) and Physical Layer (PHY) specifications: High-speed Physical Layer in the 5 GHz Band, 1999.
IEEE 802.11g—Part 11: Wireless LAN Medium Access Control (MAC) and Physical Layer (PHY) specifications: Further Higher Data Rate Extension in the 2.4 GHz Band, 2003.
ETSI TS 101 761-1 Broadband Radio Access Networks (BRAN), 2000.
Schwoerer, Ludwig et al., "VLSI Implementation of IEEE 802.11a Physical Layer", 6th International OFDM-Workshop (InOWo), Hamburg, pp. 281-0 28-4, 2001.

* cited by examiner

*Primary Examiner* — Leila Malek
(74) *Attorney, Agent, or Firm* — Dicke, Billig & Czaja, PLLC

(57) ABSTRACT

A device for detecting a useful signal by detecting a periodic signal contained in the useful signal exhibits a correlation unit for correlating the signal with the sign of the signal, taking into consideration a time delay. It also comprises an amplitude estimating unit for estimating the amplitude of the signal and a decision unit which is connected downstream of the amplitude estimating unit and the correlation unit, for deciding about the presence of the periodic signal.

19 Claims, 5 Drawing Sheets

DEVICE AND METHOD FOR DETECTING A USEFUL SIGNAL BY DETECTING A PERIODIC SIGNAL CONTAINED IN THE USEFUL SIGNAL

CROSS REFERENCE TO RELATED APPLICATION

This application is a continuation of copending International Application No. PCT/DE03/02865 filed Aug. 28, 2003 which designates the United States, and claims priority to German application no. 102 45 047.1 filed Sep. 26, 2002.

TECHNICAL FIELD OF THE INVENTION

The present invention generally relates to a device and a method for detecting a useful signal by detecting a periodic signal contained in the useful signal.

DESCRIPTION OF RELATED ART AND BACKGROUND OF THE INVENTION

By now, data transmission rates of up to 54 MBit per second are being achieved in wireless local area networks. The specifications for this can be found in "IEEE 802.11a-Part 11: Wireless LAN Medium Access Control (MAC) and Physical Layer (PHY) specifications: High-speed Physical Layer in the 5 GHZ band" and in "IEEE 802.11g-Part 11: Wireless LAN Medium Access Control (MAC) and Physical Layer (PHY) specifications: Further Higher Speed Physical Layer Extension in the 2.4 GHz Band" or also in "ETSI TS 101 761-1 Broadband Radio Access Networks (BRAN); Hiperlan Type 2: Physical (PHY) Layer". To detect a useful signal, a periodic signal is sought which is sent out at the beginning of a data burst of the useful signal.

FIG. 1 shows a timing diagram in which a periodic signal u(t) with a defined period occurs from a particular time to in addition to a noise signal n(t). Along the x axis of the diagram, the time is plotted in units of one sampling period, i.e. the sampling index, and along the y axis the amplitude of the total signal r(t) consisting of the noise signal n(t) and periodic signal u(t) is plotted. The occurrence of the periodic signal u(t) superimposed on the noise signal n(t) must be detected by means of a signal detector. If the signal detector operates faultlessly, it must find by to time $t_0$ that there is no periodic signal u(t). The probability of an erroneous detection of the periodic signal must be as low as possible in this period. Once the periodic signal u(t) has occurred at time $t_0$, on the other hand, the signal detector must verify the presence of the periodic signal u(t) as rapidly as possible. The error rate should then also be as low as possible. The periodic signal u(t), and thus the useful signal, should be verified, for example, with a probability of 90% within 4 µs.

FIG. 2 shows a possible use of such a signal detector. The analog complex signal r(t), which contains the noise signal n(t) and may contain the periodic signal u(t), is scaled by means of an amplifier with automatic gain control 1 and supplied to an analog/digital converter 2. The complex digital signal s(t), which can be picked up at the output of the analog/digital converter 2, is supplied to the signal detector 3. In addition, the signal s(t) is supplied to a receiver 4. The signal detector 3 informs the receiver 4 via a signal present at the detector output DA whether a periodic signal has been detected.

Because the amplifier with automatic gain control (AGC) 1 changes the total power, it is not sufficient for detecting the periodic signal u(t) to monitor only the power change of the signal s(t). The amplifier with automatic gain control 1 adapts the signal gain to the requirements from time to time. For this reason, the power fluctuates at the input of the analog/digital converter 2, and thus also at the input DE of the signal detector 3 which is why the change in power in the input signal s(t) does not provide reliable information on the presence or absence of the periodic signal u(t).

FIG. 3 shows the burst structure, as defined in the above-mentioned IEEE specification, which is used for data transmission and for synchronization between transmitter and receiver. The burst structure begins with a preamble STP built up of short training sequences, which is also called PLCP preamble or OFDM training structure. An 0.8-µs-long signal (short training sequence), called $t_1$ in FIG. 3, is repeated 10 times for a total of 8 µs within STP. In FIG. 3, the repetitions are identified by $t_2, t_3, \ldots, t_{10}$. This is followed by a preamble LTP built up of a guard interval GI2 and two long training sequences T1 and T2. LTP also extends over 8 µs. Since LTP and the burst sections SIGNAL, Data1, Data2 following LTP are of no consequence, there will not be discussed further in the text which follows. Explanations relating to these can be found in Section 17.3 of the above-mentioned specification IEEE 802.11a.

To detect a burst at the receiver end, the periodic signal $t_1$, $t_2, \ldots, t_{10}$ of the preamble STP is used. To detect the periodic signal in the signal s(t), the similarity of the periodic signal $t_1$, $t_2, \ldots, t_{10}$ to itself can be utilized during a shift according to the signal period. In the case where there is no periodic signal, the signal s(t) should also not exhibit any periodicity.

In the second above-mentioned ETSI specification, the short training sequence is defined slightly differently, but the periodicity of the periodic signal is also present here. Reference is made here to specification sections 5.7 and 5.8. For this reason, the periodic signal u(t) superimposed on the noise signal n(t) can also be detected in the same manner in the case of this specification.

FIG. 4 shows the real part 4.1 and the imaginary part 4.2 of a total of four signals $t_1$, to $t_4$ in the form of a timing diagram in which the sample index is plotted along the x axis and the amplitude in arbitrary units along the y axis. The sampling rate is 20 MHz, i.e. 16 samples correspond to one repetition period (0.8 µs) of the periodic signal u(t). The signals $t_1$ to $t_4$ of the periodic signal, shown in FIG. 4, should be detectable by means of the signal detector 3.

From the prior art "VLSI Implementation of IEEE 802.11a Physical Layer, L. Schwoerer, H. Wirz, Nokia Research Center, 6$^{th}$ International OFDM Workshop 2001—Hamburg, pages 28-1 to 28-4", a signal detector is known which uses the following autocorrelation function for detecting the periodic signal:

$$c_1(t) = \left| \sum_{t_i}^{t_i+T} s(t)s^*(t-\tau) \right| \quad (1)$$

where τ is one period of period signal u(t) and T is the integration or summation period. The period τ can be the repetition period (0.8 µs) or a multiple thereof, i.e. τ=0.8 µs or 1.6 µs or 2.4 µs, . . .

FIG. 5 shows two timing diagrams in which in each case the index of samples is plotted along the x axis and the amplitude along the y axis. The upper diagram shows the complex digital signal s(t). At the index of samples 20, the periodic signal u(t) occurs. In the lower diagram, the autocorrelation function $c_1(t)$ as specified above in the equation (1) is shown. The signal s(t) does not contain a noise signal in this case. The integration or summation period T is 0.8 µs. After 1.6 µs (corresponding to 32 samplings), the last 0.8 µs of the signal s(t) are correlated perfectly with the first 0.8 µs of the signal s(t), and the autocorrelation sum remains constant 1.6 µs after the occurrence of the periodic signal.

In FIG. 6, two timing diagrams are also shown, the upper timing diagram again showing the signal s(t) and the lower timing diagram showing the autocorrelation function $c_1(t)$. The sampling rate is again 20 MHz but the signal s(t) now exhibits a noise signal component. The autocorrelation value $c_1(t)$ is now no longer stable. In addition, the autocorrelation value $c_1(t)$ also deviates from the value 0 even before the periodic signal occurs. To reliably detect the periodic signal, a threshold value must be taken into consideration. If the autocorrelation value $c_1(t)$ exceeds the threshold value, it is assumed that the periodic signal is present. The higher the threshold value, the lower the probability that the autocorrelation according to the abovementioned function $c_1(t)$ falsely detects a periodic signal. The consequence of this is, however, that the higher the threshold value, the longer it takes until the periodic signal is detected.

The value of the autocorrelation $c_1(t)$ is also dependent on the power of the signal s(t). The threshold value must, therefore, be matched to the signal power. The mean value of the power of the signal s(t) is not constant because the variable-gain amplifier 1 arranged upstream of the signal detector 3 attempts to keep the output signal within an interval. This is necessary in order to avoid overdriving the analog/digital converter 2. Even if the input signal r(t) as shown in FIG. 2 exhibits a constant mean power, it is not possible to set the variable-gain amplifier 1 immediately to the correct value. This first requires a number of adjustments. Due to the gain variation, fluctuations will thus occur in the mean power of the signal s(t) at the input of the signal detector 3 in any case. To this is added that the variable-gain amplifier 1 is normally only set to a fixed final value when the periodic signal has been detected and the useful signal is being received. For this reason, the power must be estimated during the detection process. In the prior art, the following formula is used for estimating the power of the signal s(t):

$$p(t) = \left| \sum_{t_i}^{t_i+T} s(t)s^*(t) \right| \quad (2)$$

The power p(t) is estimated over the last T seconds of the signal s(t) used during the autocorrelation. During this process, attention must be paid to the fact that the delayed signal s(t−τ) of the autocorrelation is not completely detected with respect to its power, see equation (2). For this reason, a change in the gain by the amplifier 1 cannot be detected immediately completely by adjusting the threshold value.

A better solution in this respect would be to estimate the power of both signal components (of the signal s(t) and of the delayed signal s(t−τ), to multiply them by one another and then to extract the root of the product. However, this would disadvantageously cause a distinctly higher implementation expenditure.

The decision as to whether the periodic signal is present or not is made by means of the condition $$c_1(t) \geq p(t)^* thr \quad (3)$$

where thr designates the threshold value (not scaled to power) for the autocorrelation. If $c_1(t)$ is greater than or equal to the product of power p(t) and threshold value thr, it is assumed that a periodic signal is present.

The magnitude of the threshold value thr is the result of a trade-off between the desired high reliability of detection of the periodic signal and, on the other hand, the quickest possible detection of the periodic signal.

The block diagram in FIG. 7 shows the configuration of a signal detector 3 which implements the equations specified in the above-mentioned prior art.

The thick lines identify complex signals whereas the thin lines identify real signals.

The signal detector 3 shown as a block diagram in FIG. 7 has an input DE at which the input signal s(t), which is the complex digital output signal of the analog/digital converter 2, is present. The input signal s(t) is supplied to a unit for power estimation 13 which provides at its output the power estimation signal p(t) which was calculated according to equation (2). For this purpose, the unit for power estimation 13 has a unit for squaring an amount 5 and an analog adder 6. At the same time, the signal s(t) is supplied to an autocorrelation unit 15. The autocorrelation unit 15 comprises a unit 9 for forming the conjugate complex signal, a delay unit 10 for delaying the signal s(t) by the period τ, and a multiplier 16 which multiplies the signal s(t) by the delayed complex conjugate signal s*(t−τ). Following the multiplier 16, an analog adder 11 with the adding period T and a unit for absolute-value generation 12 are arranged. The output of the autocorrelation unit 15 is connected to a first input of a decision unit 14. At a second input of the decision unit 14, the threshold value thr is present. A third input of the decision unit 14 is connected to the output of the unit for power estimation 13. The threshold value thr is scaled by means of the multiplier 7. The threshold value condition according to equation (3) is checked by the comparator 8. At the output DA of the signal detector 3, a detector signal d(t) can be picked up which specifies whether a periodic signal has been detected.

SUMMARY OF THE INVENTION

It is an object of the invention to specify a device and a method for detecting a periodic signal which detect a periodic signal both reliably and rapidly with the least possible implementation expenditure. In particular, changes in the strength of the input signal should not have much effect on the reliability of detection.

The device according to the invention for detecting a useful signal by detecting a periodic signal contained in the useful signal has a correlation unit for correlating a signal, which may contain the periodic signal, with the sign of the signal, taking into consideration a time delay between the signal and the sign of the signal. In addition, it comprises an amplitude estimating unit for estimating the amplitude of the signal. Finally, there is also a decision unit for deciding about the presence of the periodic signal, which is connected downstream of the amplitude estimating unit and the correlation unit.

The method according to the invention for detecting a useful signal by detecting a periodic signal contained in the useful signal exhibits the following steps. A signal in which the periodic signal may be present is correlated with the sign of the signal, taking into consideration a time delay. The amplitude of the signal is estimated. A decision is made by means of the amplitude and the signal obtained during the correlation as to whether the periodic signal is present.

In the device according to the invention, the correlation unit may exhibit a unit for determining the sign and for delaying the signal. Furthermore, it advantageously comprises a multiplier, the first input of which is connected downstream of the unit for determining the sign and for delaying the signal, and the second input of which receives the signal. A first summing unit is connected downstream of the multiplier.

In a development of the invention, the amplitude estimating unit exhibits a unit for forming the absolute value of the real part and the absolute value of the imaginary part of the signal and a second summing unit connected downstream.

In an embodiment of the invention, the decision unit exhibits a multiplier for multiplying a signal output by the amplitude estimating unit by a predetermined value and a comparator for comparing the signal output by the correlation unit with the signal output by the multiplier.

In an additional development of the invention, a unit for absolute-value generation is provided which is connected downstream of the first summing unit.

In a further embodiment of the invention, the unit for absolute-value generation exhibits, for the purpose of estimating the absolute value, a second decision unit which is constructed in such a manner that it estimates the absolute value of the signal supplied by the first summing unit by means of an estimating function defined section by section.

In the device according to the invention, a unit for splitting up the signal can also be provided which is connected upstream of the second decision unit.

In the method according to the invention, the signal and its sign can be correlated by multiplying the signal and the time-delayed, possibly conjugate complex sign of the signal by one another and adding together a resultant signal, In a preferred embodiment of the method, the amplitude is multiplied by a predetermined value and then compared with the absolute value in order to decide whether the periodic signal is present.

The device according to the invention and the method can be preferably used in a wireless local area network, particularly according to the IEEE 802.11a standard or the ETSI TS 101 761-1 (BRAN), Hiperlan Typ 2 standard.

BRIEF DESCRIPTION OF THE DRAWINGS

In the text which follows, the invention will be described by means of an exemplary embodiment, referring to the drawing, in which.

DETAILED DESCRIPTION OF PREFERRED EMBODIMENTS

The description of FIGS. 1 to 7 will not be discussed in further detail in the text which follows, but reference is made to the explanations already made above in this respect with regard to the invention.

Figure 8:
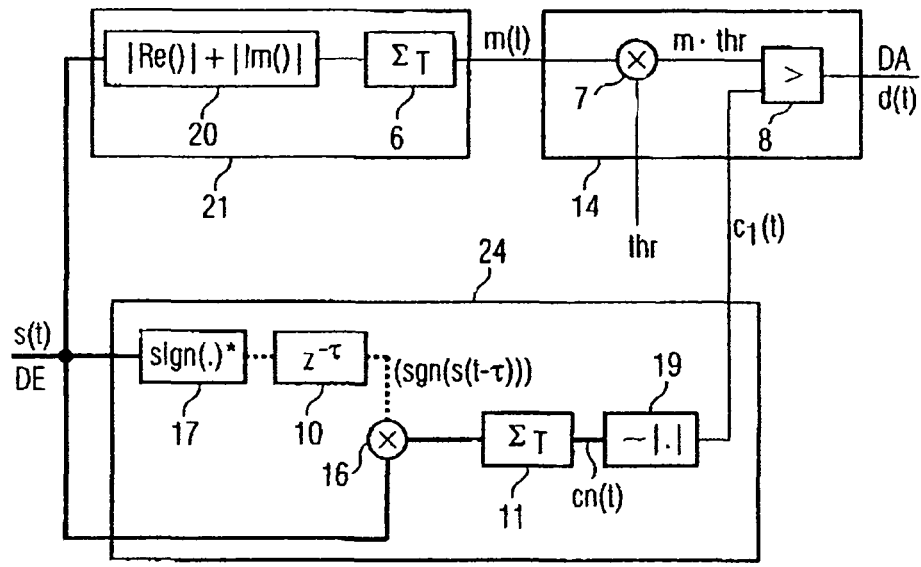
FIG. 8 shows a block diagram of the configuration of a signal detector according to the invention.

The signal detector according to the invention as shown in FIG. 8 has an input DE to which an input signal s(t), which can be complex digital output signal of the analog/digital converter 2, can be applied. The input signal s(t) is supplied to a unit for amplitude estimation 21 which provides at its output a signal with the mean amplitude value m(t). At the same time, the signal s(t) is supplied to a correlation unit 24. The output of the correlation unit 24 is connected to a first input of a decision unit 14. At the second input of the decision unit 14, a threshold value thr is present. The third input of the decision unit 14 is connected to the output of the unit for amplitude estimation 21. At the output DA of the signal detector, a detector signal d(t) can be picked up which specifies whether a periodic signal has been detected or not.

The correlation unit 24 comprises a unit for determining the sign 17, the input of which is connected to the data input DE. The unit for determining the sign 17 at the same time carries out a complex conjugation of the sign value determined. The unit for determining the sign 17 is followed by a delay unit 10 which delays the signal s(t) by the period τ. A multiplier 16 multiplies the delayed sign value, output by the delay unit 10 by the signal s(t). Following the multiplier 16, an analog adder 11 with the adding period T and a unit for absolute-value generation 19 are arranged.

The thick lines represent complex signals (2 real signals), the thick dotted lines represent complex 2-bit signals (two real 1-bit signals), and the thin lines represent real signals.

For calculating the correlation function c(t), the correlation unit 24 uses the following formula:

$$c(t) = \left| \sum_{t_i}^{t_i+T} s(t) sgn(s^*(t-\tau)) \right| \qquad (4)$$

Or the formula;

$$c(t) = \left| \sum_{t_i}^{t_i+T} s(t)(sgn(s(t-\tau)))^* \right| \qquad (5)$$

Seen mathematically, both formula (4) and (5) lead to the same result since it is of no consequence whether first the conjugate complex part is formed and then the sign is determined or whether first the sign is determined and then the conjugate complex part is formed. In practice, however, it has been found that the implementation, that is to say the implementation in a VLSI (very large scale integration) chip, of the second formula (5), in which the complex conjugation takes place after the sign calculation, is more efficient.

Unlike the prior art, the sign of the input signal s(t) is taken into consideration in the calculation of the correlation in the invention.

The sign of the complex signal s(t) is composed as follows:

$$sgn(x) = sgn(Re(x)) + j \cdot sgn(Im(x)) \qquad (6)$$

where, j designates the imaginary unit. Calculating the correlation c(t) by means of one of the two above-mentioned functions (4) and (5) entails the following advantages.

The result of the correlation c(t) is independent of the amplitude (and thus also of the adjustments of the amplifier 1) of the delayed signal component. The sign has a fixed mean amplitude value equal to one. The result of the correlation is thus influenced less strongly by changes in the gain setting of the amplifier 1.

A further advantage lies in the distinct reduction in the number of complex multiplications necessary for calculating the decision. Complex multiplications means multiplications of complex signals. In FIG. 8, it is indicated by means of the type of line how the calculations are simplified. The multiplication now requires a simple multiplier 16 in the form of a controlled adder or subtractor.

A third advantage consists in that fewer storage elements are necessary for storing the delayed part of the input signal s(t). Only 2 bits of storage space per signal sampling are required for storing the sign of the signal s(t).

Since one of the two signals has a known fixed amplitude, the mean amplitude value m(t) and not the power of the signal s(t) is used for setting the threshold value thr. The mean amplitude value m(t) can be calculated, e.g., by extracting the square root of the estimated power value p(t) determined by means of equation (2).

To simplify the calculations of the amplitude m(t) to be carried out by means of the unit for amplitude estimation 21, however, the following equation can also be advantageously used:

$$m(t) = \sum_{t_i}^{t_i+T} (|\text{Re}(s(t))| + |\text{Im}(s(t))|) \qquad (7)$$

In this equation (7), all multiplications are avoided, as a result of which chip area is saved in a VLSI chip and the power consumption can be reduced for the calculation in the digital implementation of the equation—by means of a unit 20 for forming the absolute values of the real and the imaginary part and for adding these, and of the analog adder 6. The summation in the analog adder 6 can extend, for example, over 16 time indices, which corresponds to an integration or summation period T=0.8 μs with a sampling rate of 20 MHz.

On the basis of the estimated correlation c(t), the estimated amplitude m(t) and the fixed threshold value thr, a decision criterion which will be explained in greater detail in the text which follows provides information on whether the periodic signal is present or not.

The decision criterion is:

$$c(t) \geq m(t) * thr \qquad (8)$$

If the inequality (8) is satisfied, it is assumed that the periodic signal is present. Otherwise, it is assumed that the periodic signal is not present.

The signal detector 3 can be additionally simplified by performing the absolute value generation of the amplitude during the calculation of equation (4) or (5) in the correlation unit 24 as follows. Normally, this requires multiplications and the square root. This can be avoided by a function for amplitude estimation, defined section by section. The amplitude is thus estimated as follows:

$$c = |cn| \approx \begin{cases} |\text{Re}(cn)| & \text{if} \quad |\text{Im}(cn)| < \frac{1}{4}|\text{Re}(cn)| \\ |\text{Im}(cn)| & \text{if} \quad |\text{Re}(cn)| < \frac{1}{4}|\text{Im}(cn)| \\ \frac{3}{4}(|\text{Re}(cn)| + |\text{Im}(cn)|) & \text{else} \end{cases} \qquad (9)$$

The function defined section by section according to equation (9) can also be used for solving equation (7). In this case, the unit 19 for absolute-value estimation is used instead of unit 20 for absolute-value generation.

Figure 9:
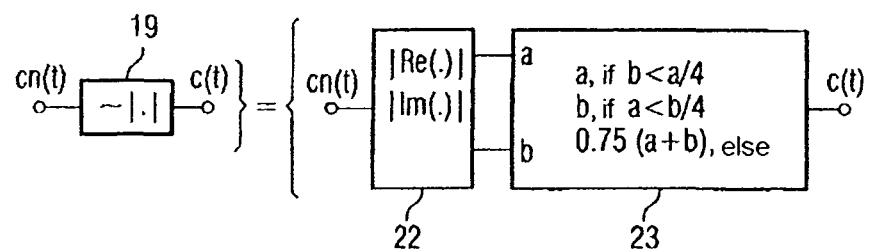
FIG. 9 shows the configuration of a unit for absolute-value generation as used in the embodiment shown in FIG. 8.

FIG. 9 shows the block diagram of the corresponding unit 19 for absolute-value estimation. The unit for absolute-value estimation 19 as shown in FIG. 8 has a unit 22 for splitting up the added signal cn(t) into the real part and the imaginary part. Furthermore, it comprises a logic circuit 23. If the imaginary part is smaller than a quarter of the real part, the absolute value of the real part is present at the output of the logic circuit 23. If, in contrast, the real part is smaller than a quarter of the imaginary part, the absolute value of the imaginary part is present at the output of the logic circuit 23. If neither the first condition nor the second condition apply, the value of three-quarters of the sum of the absolute value of the real part and of the absolute value of the imaginary part is present at the output of the logic circuit 23.

As can be seen from FIGS. 8 and 9, no further multipliers are required apart from the real multiplier 7 (since the multiplier 16, as already mentioned, can be replaced by controlled adders/subtractors and a multiplier can be completely omitted for estimating the mean amplitude value m(t) and for the absolute-value estimation performed by the unit 19). Due to these simplifications and the reduction in storage elements, a distinct saving of chip area and a distinct reduction in power consumption is achieved compared with the signal detector represented in FIG. 7.

Figure 1:
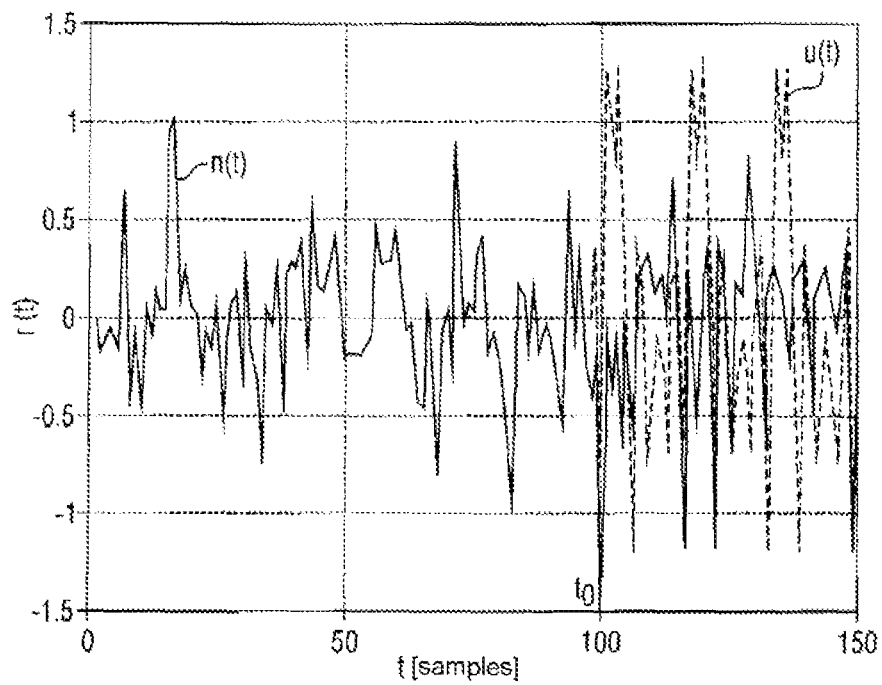
FIG. 1 shows a timing diagram of a noise signal to be evaluated, on which a periodic signal is superimposed.
Figure 2:
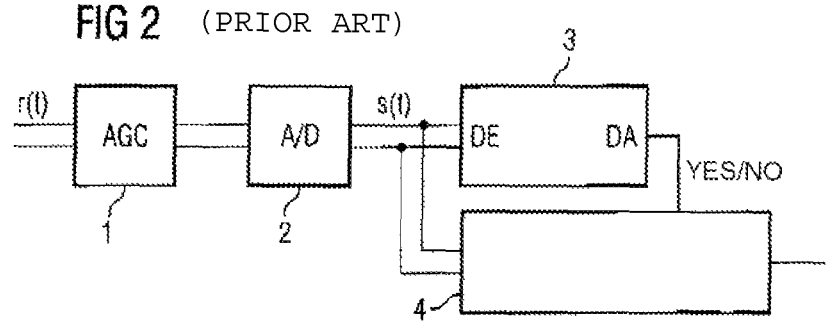
FIG. 2 shows a block diagram of a possible application of a signal detector for detecting the periodic signal.
Figure 3:
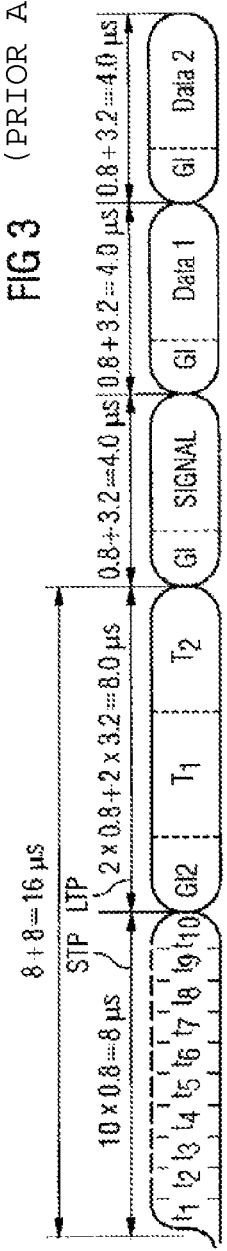
FIG. 3 shows a burst structure as described in the IEEE specification.
Figure 4:
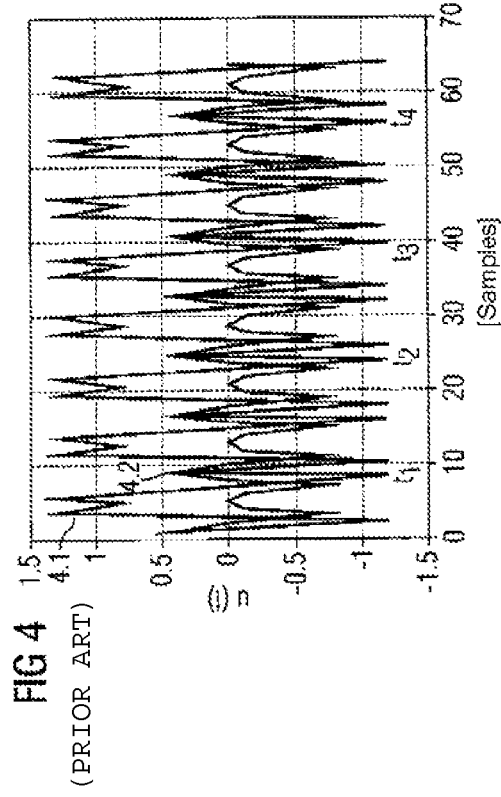
FIG. 4 shows a timing diagram of the signal during the transmission of the training sequence preamble of FIG. 3.
Figure 5:
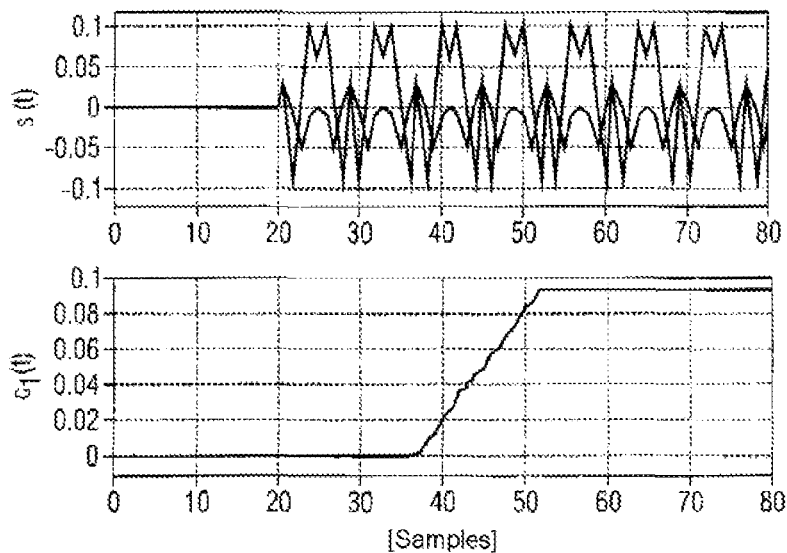
FIG. 5 shows the signal variation of a signal present at the input of the signal detector and the associated variation of the autocorrelation function.
Figure 6:
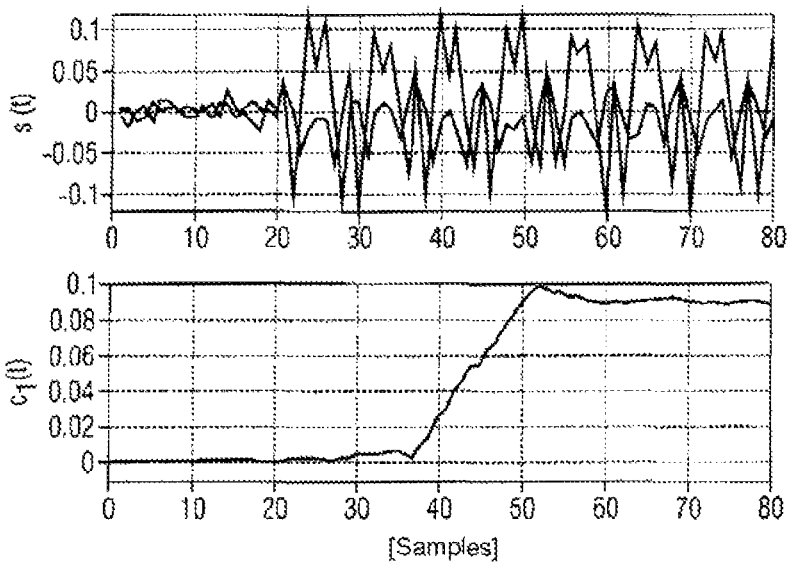
FIG. 6 shows the signal variation of a signal exhibiting a noise component and present at the input of the signal detector and the associated variation of the autocorrelation function.
Figure 7:
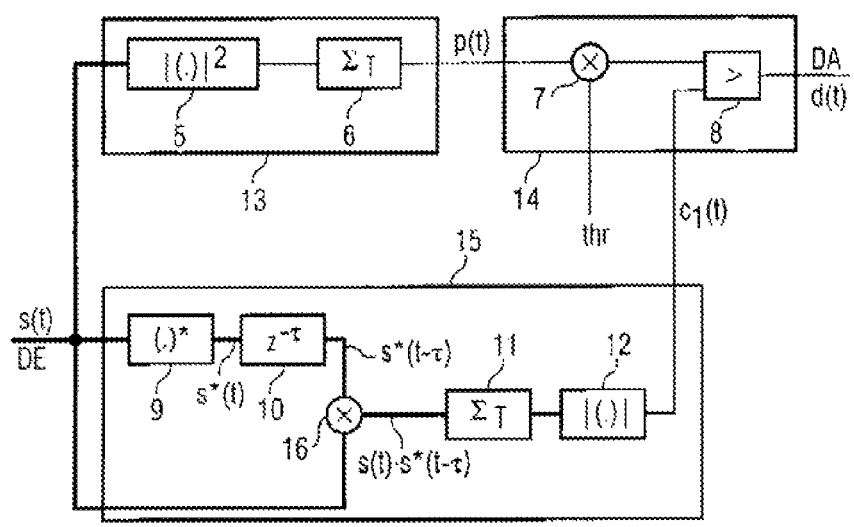
FIG. 7 shows a block diagram of the structure of a signal detector analogously to the prior art.

Naturally, the embodiment of the invention shown in FIG. 8 can be used in the circuit shown in FIG. 2. Furthermore, it is not restricted to detecting only the periodic signal according to the two above-mentioned specifications. In particular, the invention can also be used for detecting real signals.

I claim:

1. A device for detecting a useful signal by detecting a periodic signal contained in the useful signal, comprising:
   an autocorrelation unit for autocorrelating a signal, which may contain the periodic signal, with a complex conjugate/sign function of the signal, wherein the complex conjugate/sign function is one of the sign function of the complex conjugate of the signal or the complex conjugate of the sign function of the signal, wherein the complex conjugate/sign function of the signal is delayed in time with respect to the signal,
   an amplitude estimating unit for estimating the amplitude of the signal, and
   a decision unit, which receives a signal output by the amplitude estimating unit and a signal output by the autocorrelation unit, for deciding about the presence of the periodic signal.

2. The device as claimed in claim 1, wherein the autocorrelation unit exhibits the following:
   a unit for delaying the signal and for determining the complex conjugate/sign function of the delayed signal to make the complex conjugate/sign function of the signal delayed in time with respect to the signal,
   a multiplier, the first input of which is connected downstream of the unit for determining the complex conjugate/sign function and for delaying the signal, and the second input of which receives the signal, and a summing unit having an input coupled to an output of the multiplier.

3. The device as claimed in claim 1, wherein the amplitude estimating unit exhibits a unit for forming the absolute value of the real part and the absolute value of the imaginary part of the signal and a summing unit having an input coupled to an output of the unit for forming the absolute value of the real part and the absolute value of the imaginary part.

4. The device as claimed in claim 1, wherein the decision unit exhibits a multiplier for multiplying the signal output by the amplitude estimating unit by a predetermined value, and a comparator for comparing the signal output by the autocorrelation unit with a signal output by the multiplier.

5. The device as claimed in claim 2, comprising a unit for absolute-value generation having an input coupled to an output of the summing unit.

6. The device as claimed in claim 5, wherein the unit for absolute-value generation, exhibits, for the purpose of estimating the absolute value, a second decision unit which is constructed in such a manner that it estimates the absolute value of a supplied signal (cn(t)) via an estimating function defined section by section.

7. The device as claimed in claim 6, wherein the unit for absoluate-value generation includes a unit for splitting up the supplied signal (cn(t)) into real part and imaginary part and providing the real part and the imaginary part to the second decision unit.

8. A method for detecting a useful signal by detecting a periodic signal contained in the useful signal, comprising the steps of:

autocorrelating, with a device, a signal in which the periodic signal may be present with a complex conjugate/sign function of the signal, wherein the complex conjugate/sign function is one of the sign function of the complex conjugate of the signal or the complex conjugate of the sign function of the signal, wherein the complex conjugate/sign function of the signal is time-delayed with respect to the signal, estimating the amplitude of the signal, and making a decision by comparing the amplitude and the signal obtained during the autocorrelation as to whether the periodic signal is present.

9. The method as claimed in claim 8 wherein autocorrelating the signal comprises:

time-delaying the signal, and determining the complex conjugate/sign function of the time-delayed signal to make the complex conjugate/sign function of the signal time-delayed with respect to the signal.

10. The method as claimed in claim 9, wherein the signal and its complex conjugate/sign function are autocorrelated by multiplying the signal and the complex conjugate/sign function of the time-delayed signal by one another and adding together a resultant signal.

11. The method as claimed in claim 10, wherein an absolute value is formed from the signal obtained by the adding together.

12. The method as claimed in claim 11, wherein the absolute value is estimated by using an estimating function defined section by section.

13. The method as claimed in claim 11, wherein the amplitude is multiplied by a predetermined value and then compared with the absolute value in order to decide whether the periodic signal is present.

14. The method as claimed in claim 8, wherein the useful signal is a useful signal in a wireless local area network.

15. A device for detecting a useful signal by detecting a periodic signal contained in the useful signal, comprising:

an autocorrelation unit for autocorrelating a signal, which may contain the periodic signal, with a complex conjugate/sign function of the signal, wherein the complex conjugate/sign function is one of the sign function of the complex conjugate of the signal or the complex conjugate of the sign function of the signal, wherein the autocorrelation unit comprises:

a unit for delaying the signal and for determining the complex conjugate/sign function of the delayed signal, a first multiplier, the first input of which receives the complex conjugate/sign function of the delayed signal, and the second input of which receives the signal, and a first summing unit having an input coupled to an output of the first multiplier, a unit for absolute-value generation having an input coupled to an output of the first summing unit, an amplitude estimating unit for estimating the amplitude of the signal, and a decision unit, which receives a signal output by the amplitude estimating unit and a signal output by the autocorrelation unit, for deciding about the presence of the periodic signal.

16. The device as claimed in claim 15, wherein the amplitude estimating unit exhibits a unit for forming the absolute value of the real part and the absolute value of the imaginary part of the signal and a second summing unit having an input coupled to an output of the unit for forming the absolute value of the real part and the absolute value of the imaginary part.

17. The device as claimed in claim 15, wherein the decision unit exhibits a second multiplier for multiplying a signal output by the amplitude estimating unit by a predetermined value, and a comparator for comparing the signal output by the autocorrelation unit with the signal output by the second multiplier.

18. The device as claimed in claim 16, wherein the unit for absolute-value generation in the amplitude estimating unit and/or the unit for absolute-value generation in the autocorrelation unit, exhibits or exhibit, for the purpose of estimating the absolute value, a second decision unit which is constructed in such a manner that it estimates the absolute value of a supplied signal (cn(t)) via an estimating function defined section by section.

19. The device as claimed in claim 18, wherein the unit for absolute-value generation in the amplitude estimating unit and/or the unit for absolute-value generation in the autocorrelation unit comprises a unit for splitting up the supplied signal (cn(t)) into real part and imaginary part and providing the real part and the imaginary part to the second decision unit.

* * * * *